(12) United States Patent
Ozawa et al.

(10) Patent No.: US 8,575,765 B2
(45) Date of Patent: Nov. 5, 2013

(54) SEMICONDUCTOR PACKAGE HAVING UNDERFILL AGENT DISPERSION

(75) Inventors: Takashi Ozawa, Nagano (JP); Seiji Sato, Nagano (JP); Kazuyuki Izumi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 490 days.

(21) Appl. No.: 12/751,296

(22) Filed: Mar. 31, 2010

(65) Prior Publication Data
US 2010/0252938 A1 Oct. 7, 2010

(30) Foreign Application Priority Data
Apr. 1, 2009 (JP) .............................. P2009-089229

(51) Int. Cl.
*H01L 29/40* (2006.01)
*H01L 23/495* (2006.01)
*H01L 23/10* (2006.01)
*H01L 21/00* (2006.01)

(52) U.S. Cl.
USPC ............ 257/778; 257/667; 257/707; 438/118

(58) Field of Classification Search
USPC ..................... 257/778, 667, 707; 438/118
See application file for complete search history.

(56) References Cited

U.S. PATENT DOCUMENTS

| 6,653,720 | B2 * | 11/2003 | Kameda ......................... 257/667 |
| 6,743,661 | B1 * | 6/2004 | Drewery ........................ 438/110 |
| 2002/0003308 | A1 * | 1/2002 | Kim et al. ...................... 257/778 |
| 2003/0034568 | A1 * | 2/2003 | Chai et al. ..................... 257/788 |
| 2004/0155358 | A1 * | 8/2004 | Iijima .......................... 257/778 |
| 2005/0006789 | A1 * | 1/2005 | Tomono et al. ................. 257/778 |
| 2008/0142993 | A1 * | 6/2008 | Ozawa et al. .................. 257/778 |
| 2009/0152691 | A1 * | 6/2009 | Nguyen et al. ................. 257/667 |

FOREIGN PATENT DOCUMENTS

| JP | 2004-349399 | 12/2004 |
| JP | 2007-123558 | 5/2007 |

* cited by examiner

*Primary Examiner* — Long K Tran
*Assistant Examiner* — Dzung Tran
(74) *Attorney, Agent, or Firm* — Drinker Biddle & Reath LLP

(57) ABSTRACT

A semiconductor package includes: a semiconductor element mounted on a one-sided plane of a wiring board; an underfill agent dropped so as to be filled between the semiconductor element and the wiring board; and a pad group constituted by a plurality of pads which are formed in the vicinity of a circumference of the wiring board and along the circumference, the pad group being formed on a bottom plane of a groove portion formed in a solder resist which covers the one-sided plane of the wiring board, wherein a corner edge of the groove portion located in the vicinity of a dropping starting portion to which dropping of the underfill agent is started is formed at an obtuse angle or in an arc shape in order to avoid the dropped underfill agent from entering into an inner portion of the groove portion.

8 Claims, 8 Drawing Sheets

SEMICONDUCTOR PACKAGE HAVING UNDERFILL AGENT DISPERSION

CROSS-REFERENCE TO RELATED APPLICATION

This application is based on and claims priority under 35 U.S.C. §119 from Japanese Patent Application No2009-089229 filed on Apr. 1, 2009.

BACKGROUND OF THE INVENTION

1. Field

The present invention is related to semiconductor package.

2. Description of the Related Art

Among semiconductor devices, the below-mentioned semiconductor devices have been proposed: That is, as shown in FIGS. 6A and 6B, on semiconductor package in which semiconductor elements have been mounted on wiring boards, electronic components such as either other semiconductor elements or other semiconductor devices are packaged in three-dimensional manners. As to the semiconductor device indicated in FIG. 6A, a semiconductor element 104 stacked on a semiconductor element 102 mounted on a one-sided plane of a wiring board 100 by the flip chip method is electrically connected to the one-sided plane of the wiring board 100 by employing a plurality of wires 106, 106.

Also, another semiconductor device having a POP structure represented in FIG. 6B has been proposed. As to the semiconductor device shown in FIG. 6B, a second semiconductor device 204 stacked on a first semiconductor device constructed of a semiconductor element 202 mounted on a one-sided plane of a wiring board 200 by the flip chip method is electrically connected to the one-sided plane of the wiring board 200 by employing a plurality of connection terminals 206, 206.

In any of the above-described semiconductor devices shown in FIGS. 6A and 6B, an underfill agent 108 (208) is filled into a gap between the wiring board 100 (200) and the semiconductor element 102 (202).

The above-explained underfill agent 108 (208) is filled into the gap between the semiconductor element 102 (202) and the wiring board 100 (200) by dropping a fluid type underfill agent from a nozzle (not shown) located in the vicinity of the semiconductor element 102 (202) mounted on the wiring board 100 (200).

However, similarly, in the semiconductor devices indicated in FIGS. 6A and 6B, in order to meet with thin layer requirements, the gap between the wiring board and the semiconductor element mounted thereon is made narrow, so that the dropped fluid type underfill agent can be hardly entered into the gap between the semiconductor element and the wiring board. As a result, the dropped fluid type underfill agent may easily spread along an outer circumferential direction of the wiring board, so that pads to which edge portions of the bonding wires 106 are connected and pads to which the connection terminals 206 are connected may be partially, or entirely covered by the underfill agent, while these pads are provided in the vicinity of the outer circumference of the wiring board 100 (200) shown in FIGS. 6A and 6B.

In order to avoid such an event that the pads are partially, or entirely covered by the above-described fluid type underfill agent, semiconductor package represented in FIG. 7A has been proposed in the below-mentioned patent publication 1.

In the semiconductor package represented in FIGS. 7A and 7B, a concave groove 306 is formed in a solder resist 302 which covers a one-sided plane of a wiring board 300 in order to avoid that the remainder of an underfill agent 308 which is not filled into a gap between a semiconductor element 304 and the solder resist 302 spreads between a semiconductor element 304 mounted in the flip chip method and an outer circumference of the wiring board 300 along an outer circumferential direction of the wiring board 300.

[Patent Publication 1] JP-A-2004-349399

In accordance with the semiconductor package shown in FIG. 7A, as represented in FIG. 7B, spreading of the remainder of the underfill agent 308 along the outer circumferential direction of the wiring board 300 is disturbed by the concave groove 306. As a result, it is possible to avoid that members such as pads provided in the vicinity of the outer circumference of the wiring board 300 are partially, or entirely covered by the underfill agent 308.

However, there are requirements for forming thin layers and requirements for making compact structures with respect to semiconductor packages. As explained with reference to FIGS. 7A and 7B, in the semiconductor package, spaces for forming the concave groove 306 are gradually reduced between the semiconductor element 304 mounted on the wiring board 300 and the outer circumference of the wiring board 300.

SUMMARY OF THE INVENTION

As a consequence, the present invention has an object to provide semiconductor package capable of solving the problems of the conventional semiconductor package, and capable of being made compact, while a member formed in the vicinity of an outer circumference of a wiring board is not covered by the remainder of an underfill agent. While the conventional semiconductor package cannot be made compact, the concave groove for avoiding that the remainder of the underfill agent spreads along the outer circumferential direction of the wiring board is required to be formed between the wiring board and the semiconductor element mounted thereon in order that the members formed in the vicinity of the outer circumference of the wiring board are not covered by the remainder of the underfill agent.

In order to solve the above-described problems, inventors of the present invention manufactured such a semiconductor package shown in FIG. 8 as trial production. In the semiconductor package shown in FIG. 8, a plurality of groove portions 406 each having a rectangular shape are formed in a solder resist 402 which covered a one-sided plane of a wiring board 400, and a pad group constructed of a plurality of pads 408, 408, is formed on bottom planes of the groove portions 406, 406. These pads 408, 408 are such pads which are wirebonded to a semiconductor element to be stacked on a semiconductor element 404 mounted on the wiring board 400 in the flip chip method.

However, when dropping of fluid type underfill agents 410 from a nozzle (not shown) is started at a position "A" between the semiconductor element 404 and one of the groove portions 406, 406 and the nozzle is moved along an arrow direction, and thereafter, the underfill agents 410 are filled into a gap between the semiconductor element 404 and the wiring board 400, as indicated in FIG. 8, the remainder of the underfill agent 410 entered into inner portions of the groove portions 406, so that such pads 408 are produced which are partially, or entirely covered by the underfill agents 410.

On the other hand, when an investigation is made of such a portion that the underfill agent 410 started to enter into the groove portions 406, the below-mentioned fact could be revealed: That is, the above-described portion corresponds to corner edges (indicated by symbol "○" in FIG. 8) of the groove portions 406 and 406 which are located near the portion where dropping of the fluid type underfill agents 410 from the nozzle is started.

As a consequence, the Inventors of the present invention could find out such a fact, so that the present invention could be invented. As this fact, when corner portions of the groove portions 406 and 406 are made at obtuse angles, which are located in the vicinity of the position "A" where dropping of the fluid type underfill agents 410 is started, the Inventors could find out such a fact that the penetration of the fluid type underfill agent 410 into the inner portions of the groove portions 406 could be prevented.

According to a first aspect of the invention, there is provided a semiconductor package including:

a semiconductor element mounted on a one-sided plane of a wiring board in a flip chip method;

an underfill agent dropped so as to be filled between the semiconductor element and the wiring board; and a pad group constituted by a plurality of pads which are formed in the vicinity of a circumference of the wiring board and along the circumference and which are electrically connected to an electronic component to be stacked over the semiconductor element, the pad group being formed on a bottom plane of a groove portion formed in a solder resist which covers the one-sided plane of the wiring board, wherein a corner edge of the groove portion located in the vicinity of a dropping starting portion to which dropping of the underfill agent is started is formed at an obtuse angle or in an arc shape.

According to a second aspect of the invention, there is provided the semiconductor package as in the first aspect, wherein the corner edge of the groove portion located in the vicinity of the dropping starting portion for the underfill agent is the obtuse angle, and a plurality of the groove portions located in the vicinity of the dropping starting portion are coupled to each other by a narrowed groove portion having a width which is narrower than a width of each of the groove portions.

As a result, it is possible to avoid that the underfill agent enters from such a corner edge located on the side of an outer circumferential edge of the wiring board rather than the corner portion of the groove portion positioned in the vicinity of the dropping starting portion for the underfill agent.

According to a third aspect of the invention, there is provided the semiconductor package as in the first or the second aspect, wherein the pads which construct the pad group are wire bonding-purpose pads.

It is possible to avoid that the underfill agent enters into the inner portions of the groove portions in which a large number of the above-described wire bonding-purpose pads have been formed.

BRIEF DESCRIPTION OF THE DRAWINGS

A general architecture that implements the various features of the invention will now be described with reference to the drawings. The drawings and the associated descriptions are provided to illustrate embodiments of the invention and not limited the scope of the invention.

DETAILED DESCRIPTION OF THE PREFERRED EMBODIMENTS

Figure 1:
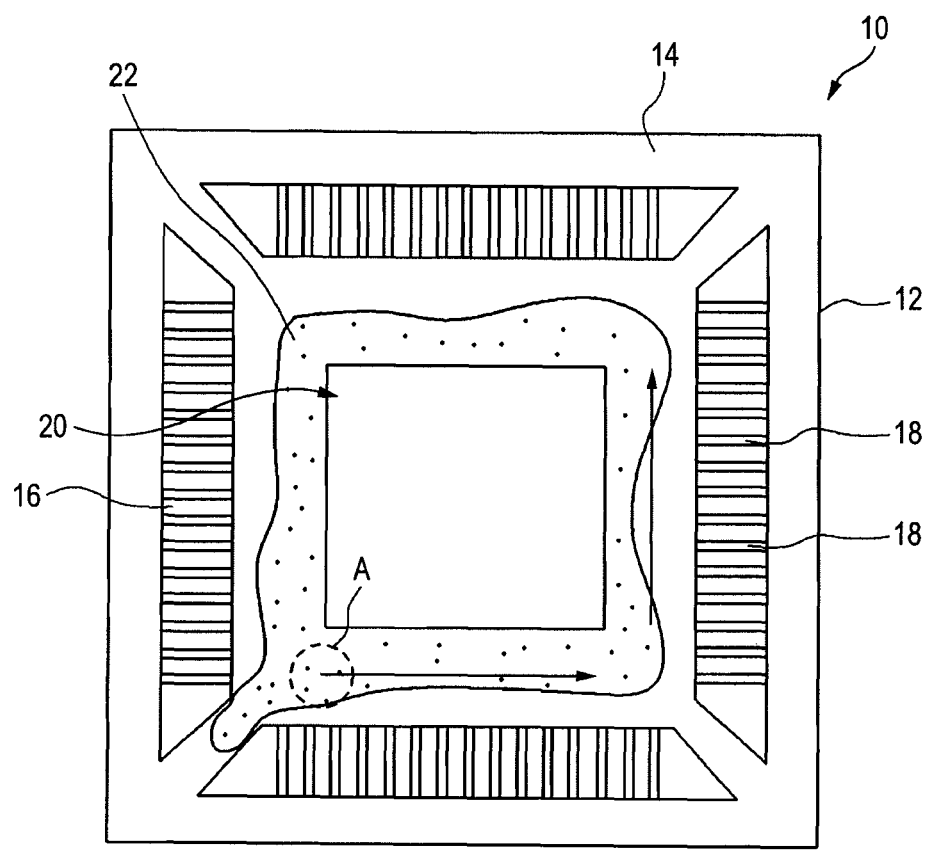
FIG. 1 is a front view for showing one example of semiconductor package according to the present invention.

FIG. 1 shows one example of semiconductor package 10 according to the present invention. In the semiconductor package 10 represented in FIG. 1, a plurality of groove portions 16, 16 are formed in a solder resist 14 which covers a one-sided plane of a wiring board 12, and a pad group constructed of a plurality of pads 18, 18 is formed on bottom planes of the groove portions 16, 16. These pads 18, 18 are such pads which are wire-bonded with a semiconductor element to be stacked on a semiconductor element 20 mounted on the wiring board 12 by the flip chip method. The above-described groove portions 16, 16 are formed in correspondence with respective sides of the mounted semiconductor element 20.

Figure 2:
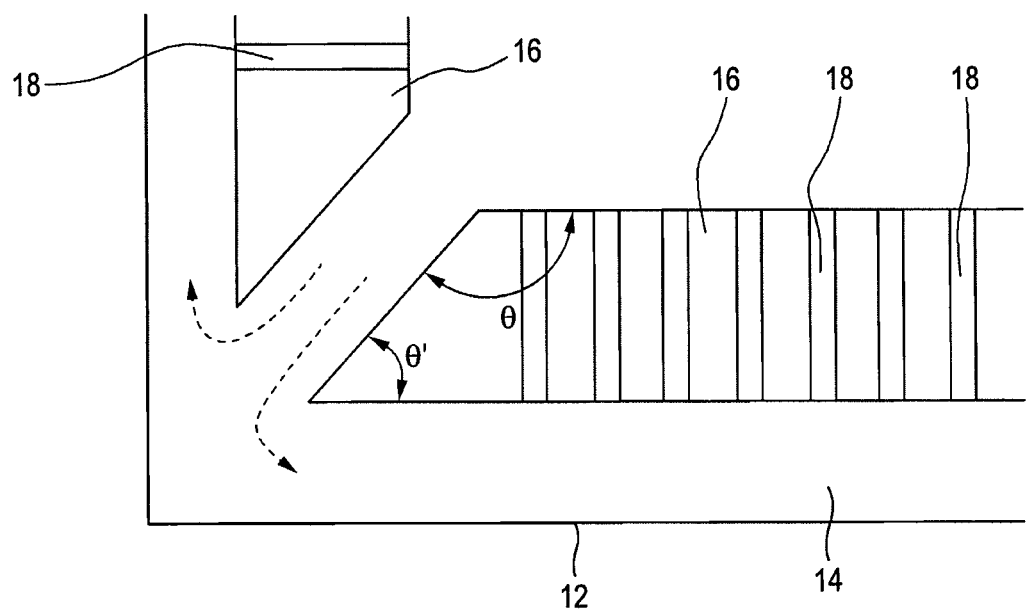
FIG. 2 is a partially enlarged view of the semiconductor package shown in FIG. 1.

As indicated in FIG. 1, each of these groove portions 16, 16 has a trapezoidal shape, and is formed in such a manner that a shorter side of this trapezoidal shape is located on the side of the semiconductor element 20. As a result, an angle "θ" at a corner edge of each of the groove portions 16, 16 is made at an obtuse angle as shown in FIG. 2.

When an underfill agent 22 is filled into a gap formed between the wiring board 12 shown in FIG. 1 and the semiconductor element 20 mounted on the wiring board 12, dropping of the fluid type underfill agent 22 is started from a nozzle (not shown) at a position located in the vicinity of a corner portion of the semiconductor element 20 between the groove portions 16, 16, and the semiconductor element 20, for example, a position "A" represented in FIG. 1; and while the fluid type underfill agent 22 is dropped from the nozzle, the nozzle is moved in an arrow direction along an outer circumference of the semiconductor element 20.

At this time, the underfill agents 22 which are contacted to the corner edges of the groove portions 16 and 16 located near the position "A" (namely, dropping starting portion) at which dropping of the underfill agent 22 is started from the nozzle are not concentrated to an intersection point of the corner edges, but are dispersed. As a result, it is possible to avoid that the underfill agents 22 are entered from the intersection point of the corner edges into the groove portions 16, 16.

An occurrence of this phenomenon may be guessed based upon the following reason: That is, the underfill agents 22 whose dropping is started at the position "A" are contacted to the corner edges of the groove portions 16 located near the position "A." Since the angle "θ" of the corner edge of each of the groove portions 16, 16 is the obtuse angle, surface tension of the underfill agents 22 is dispersed over the entire corner edges, so that it is possible to avoid that the underfill agents 22 are concentrated to the intersection portions of the corner edges.

Figure 3A:
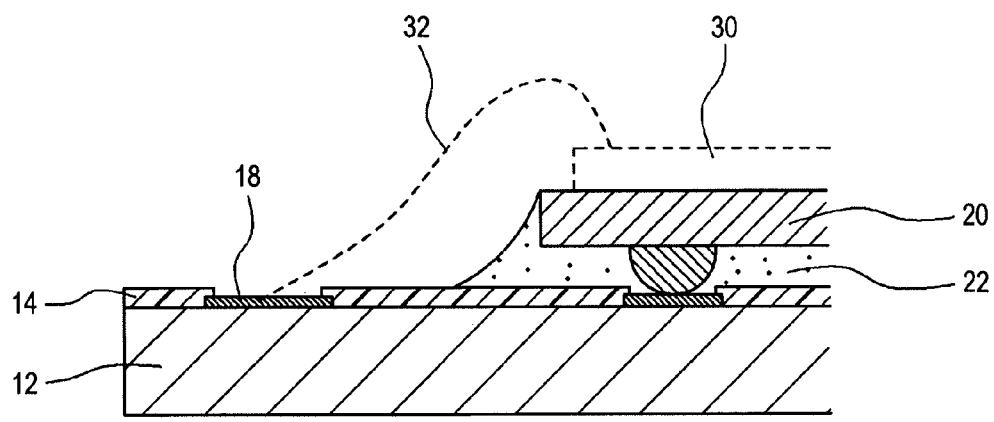
FIGS. 3A and 3B are partially sectional views of the semiconductor package in which an underfill agent has been filled into a gap between a semiconductor element and a wiring board.

Since the underfill agent 22 is filled into the gap between the semiconductor element 20 and the wiring board 12 in the above-described manner, as represented in FIG. 3A, the underfill agent 22 flown out on the solder resist 14 between the semiconductor element 20 and the groove portions 16, 16 remains on the solder resist 14. As a consequence, respective upper planes of the pads 18, 18 are exposed from the bottom planes of the groove portions 16, 16.

For instance, as shown in FIG. 3A, the other end portion of a wire 32 is connected to each of the upper planes of these pads 18, 18 while one end portion of the wire 32 is connected to an electrode terminal of a semiconductor element 30 to be mounted on the above-described semiconductor element 20.

Figure 3B:
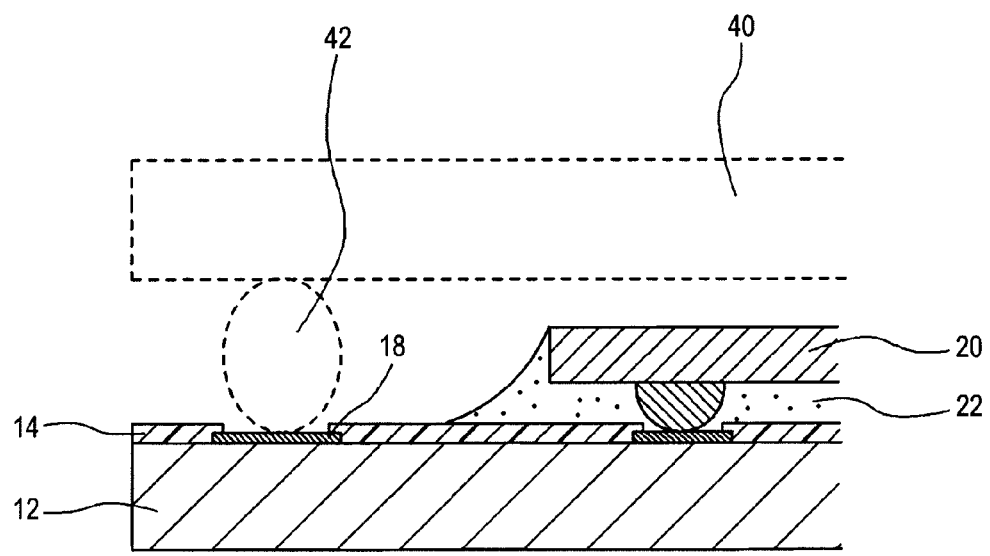

Otherwise, as shown in FIG. 3B, the other end portion of a connection terminal 42 is connected to each of the upper planes of these pads 18, 18 while one end portion of the connection terminal 42 is connected a semiconductor device 40 to be mounted over the above-described semiconductor element 20.

Since the groove portions 16, 16 are made in the trapezoidal shapes as explained in the semiconductor package of FIGS. 1 and 2, there are some cases that the fluid type underfill agent 22 may move around to spaces located on the side of longer sides of the groove portions 16, 16 as shown in FIG. 2. In these cases, since an angle "θ" of a corner edge of each of the longer sides of the groove portions 16, 16 is an acute angle, there is such a risk that the underfill agent 22 may enter into the inner portions of the groove portions 16, 16 from an intersection portion of this corner edge.

Figure 4:
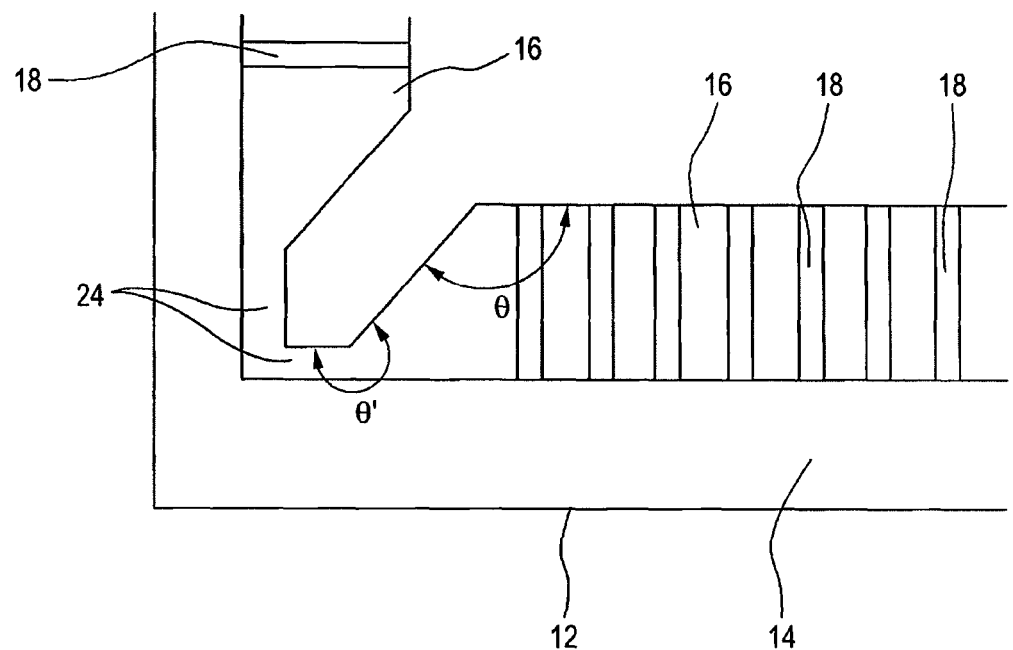
FIG. 4 is a partially enlarged view for explaining another example of semiconductor package according to the present invention.

In this case, as indicated in FIG. 4, the groove portions 16, 16 and 16 located near the position "A" corresponding to the dropping starting portion of the underfill agents 22 are coupled to each other by narrowed groove portions 24 and 24, the widths of which are narrower than those of the groove portions 16 and 16. As a result, the angle "θ" of the corner edge of each of the longer sides can be made as an obtuse angle.

It should be understood that although the narrowed groove portions 24 and 24 shown in FIG. 4 have been intersected with each other at a right angle, an amount of the underfill agents 22 reached to the above-described intersection portion is small. As a result, there is no risk that the underfill agents 22 enter from this intersection portion into inner portions of the narrowed groove portions 24 and 24.

Figure 5:
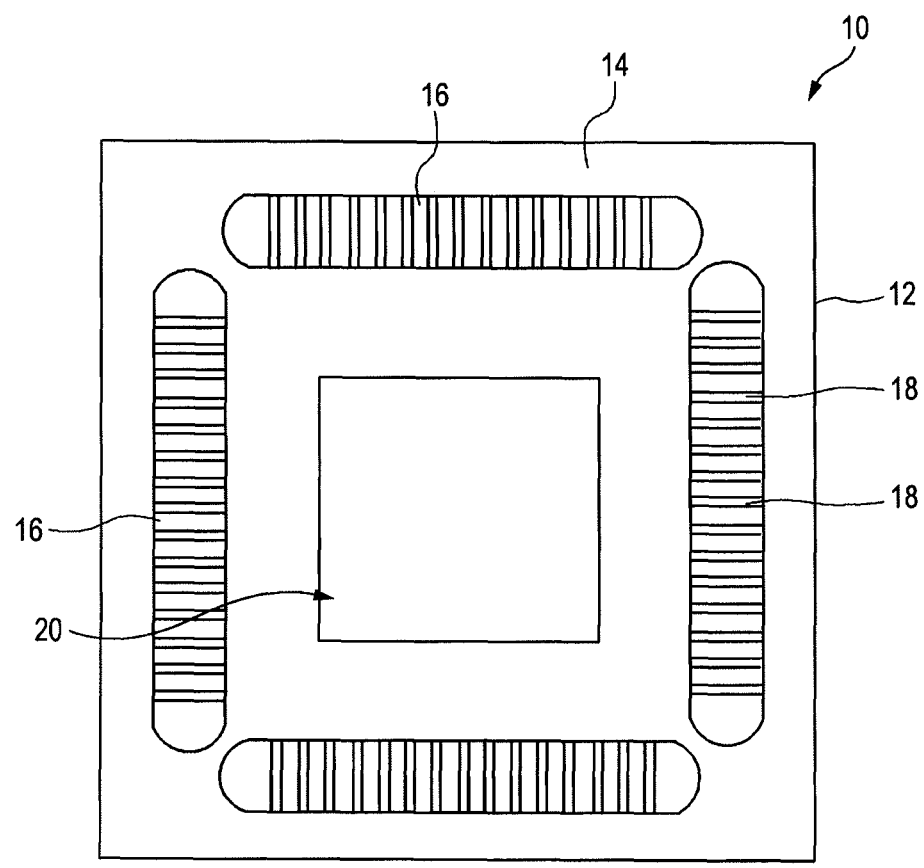
FIG. 5 is a front view for explaining another example of the semiconductor package according to the present invention.
Figure 6A:
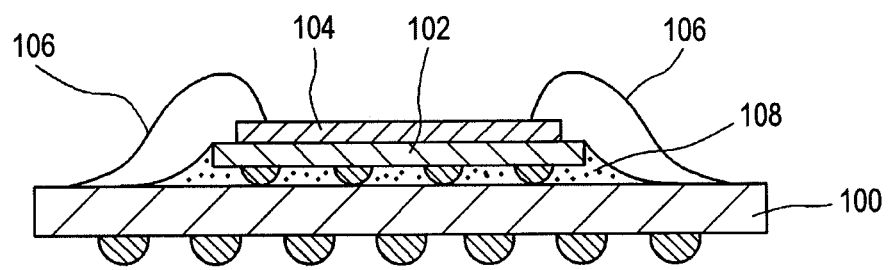
FIGS. 6A and 6B are sectional views for describing a semiconductor device in which either another semiconductor element or another semiconductor device has been packaged as the electronic component in the three dimensional manner.
Figure 6B:
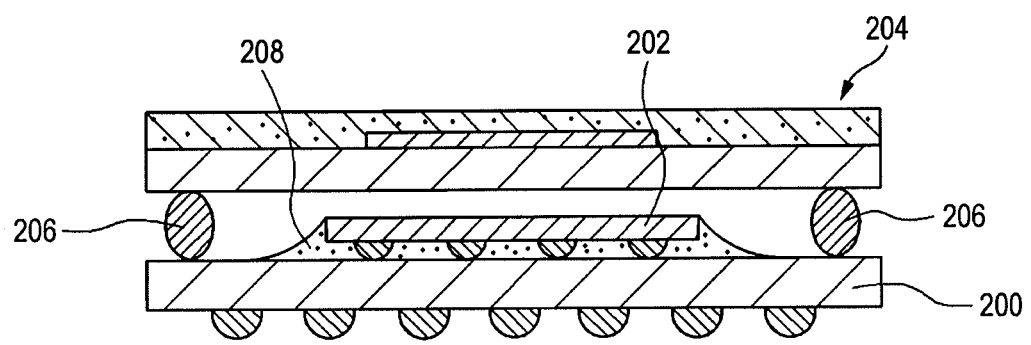

Although the groove portions 16, 16 have been formed in the trapezoidal shapes in the above-described semiconductor package shown in FIGS. 1 to 4, shapes of edge portions of groove portions 16, 16 may be made in arc shapes as realized in semiconductor package represented in FIG. 5, so that it is possible to furthermore avoid that fluid type underfill agents 22 dropped from the nozzle enter into the inner portions of the groove portions 16, 16. In accordance with the groove portions 16, 16 whose edge portions are made in the arc shapes, as shown in FIG. 2, corner edges of the groove portions 16, 16 can be formed in arc shapes with respect also to the underfill agent 22 which moves around to circumferential sides of the wiring board 12. As a consequence, these groove portions 16 and 16 need not be coupled to each other by the narrowed groove portions 24 and 24 shown in FIG. 4.

Also, although the groove portions 16, 16 having the trapezoidal shapes and the groove portions 16, 16 whose edge portions are made in the arc shapes have been formed in correspondence with the respective sides of the semiconductor element 20 mounted on the wiring board 12 in the semiconductor package represented in FIGS. 1 to 5, since such groove portions 16 and 16 located in the vicinity of the position "A" (namely, dropping starting portion) where dropping of the fluid type underfill agent 22 from the nozzle is started may be formed as the groove portion 16 having the trapezoidal shape, or the groove portion 16 whose edge portion is formed in the arc shape, it is possible to avoid that the underfill agent 22 is entered into the inner portions of these groove portions 16.

Figure 7A:
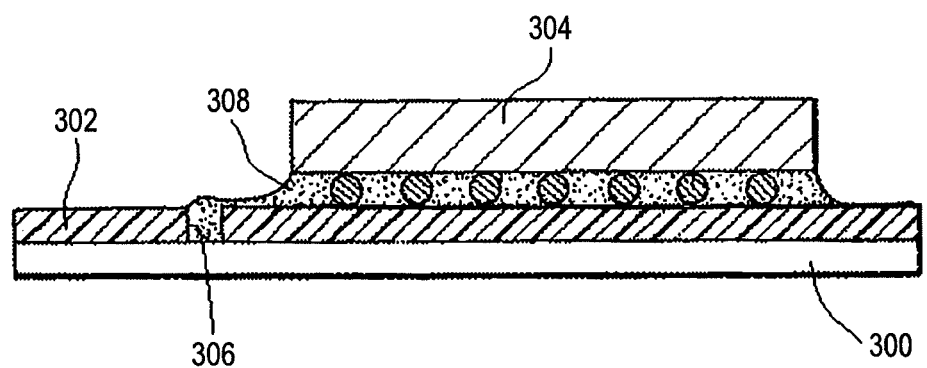
FIGS. 7A and 7B are a sectional view and a front view that describe the conventional package equipped with the concave groove capable of preventing ref lows of the underfill agent filled into the gap between the semiconductor element and the wiring board.
Figure 7B:
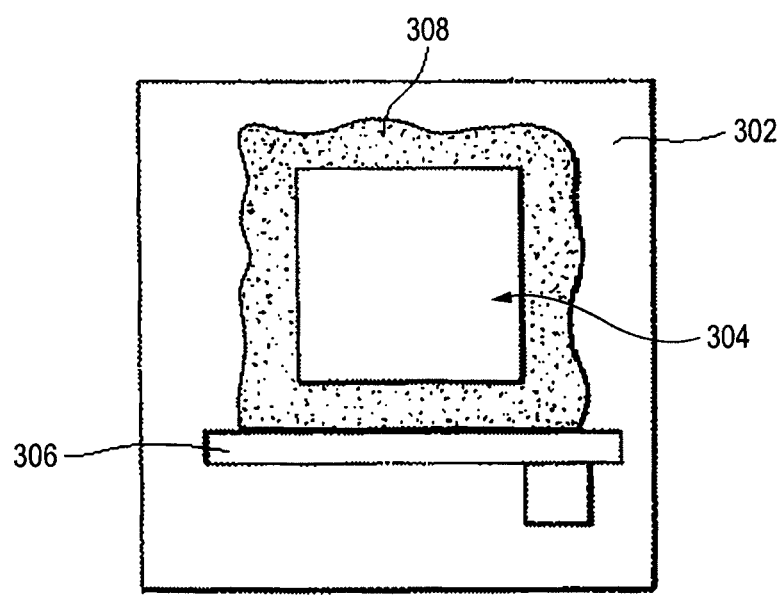
Figure 8:
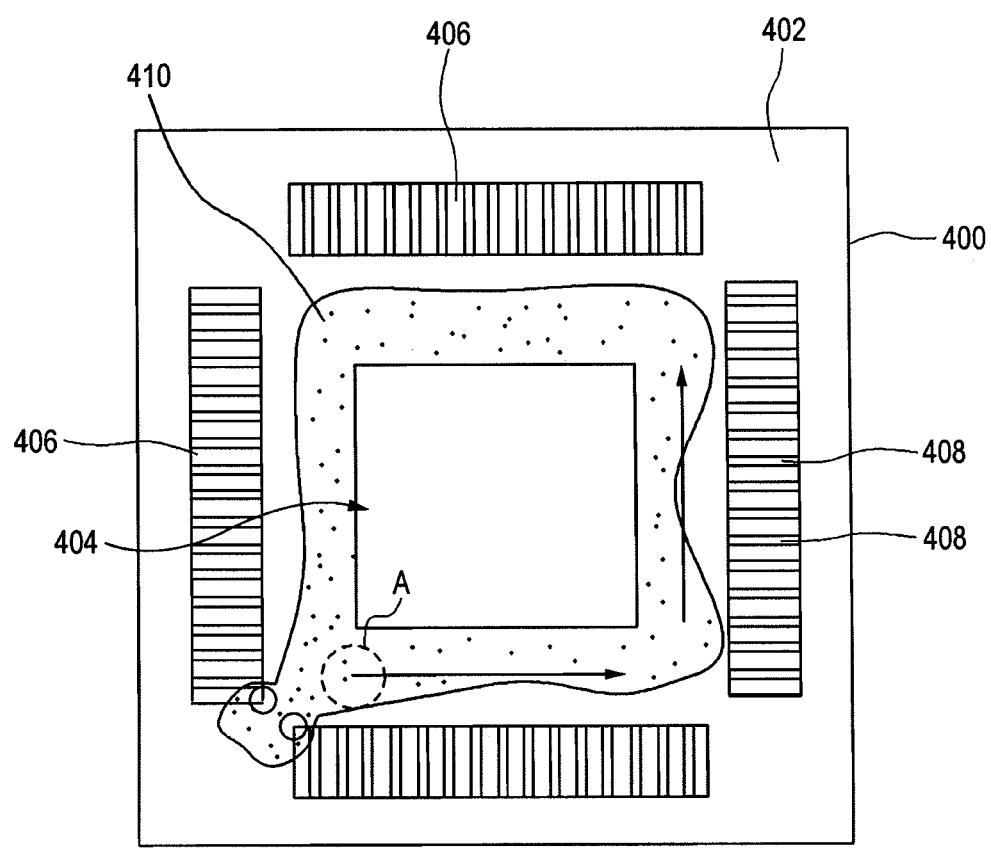
FIG. 8 is a front view for showing the semiconductor package manufactured by the Inventors of the present invention as the trial production in order to check whether or not ref lows of the underfill agents filled into the gap between the semiconductor element and the wiring board can be prevented by the groove portion in which the pad group has been formed on the bottom plane thereof.

Moreover, in the semiconductor package shown in FIGS. 1 to 5, the groove portions 16, 16 have been formed in correspondence with the respective sides of the semiconductor element 20 mounted on the wiring board 12. Alternatively, as shown in FIGS. 7A and 7B, the semiconductor element 20 may be mounted on one side of the wiring board 12 in an unbalance condition, and the groove portions 16, 16 may be formed only on one side of the semiconductor element 20.

Alternatively, a plurality of bending portions formed at obtuse angles may be provided on the corner edges of the semiconductor package shown in FIGS. 1 to 5.

It should also be noted that as the electronic components which are packaged on the semiconductor package 10 in the three-dimensional manner, chip capacitors, chip resistors, and the like may be employed in addition to semiconductor element and semiconductor devices.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all the components disclosed in the embodiments. Further, components in different embodiments may be appropriately combined.

What is claimed is:

1. A semiconductor package comprising:
    a wiring board comprising a first surface and a second surface opposite to the first surface;
    a plurality of pad groups on the first surface of the wiring board, each comprising a plurality of first pads to which an external device is to be electrically connected and which are arranged in a line, wherein each of the pad groups is arranged along a corresponding side of the wiring board;
    a solder resist on the first surface of the wiring board and comprising a plurality of elongated openings therethrough, wherein each of the pad groups is exposed from a corresponding one of the elongated openings, and wherein each of the openings is arranged along a corresponding side of the wiring board;
    a plurality of second pads for flip-chip mounting, which are provided on the first surface of the wiring board to be exposed from the solder resist;
    a semiconductor element flip-chip mounted on the first surface of the wiring board to be electrically connected to the plurality of second pads, wherein the semiconductor element is surrounded by the respective elongated openings, and the respective elongated openings are formed between the corresponding side of the wiring board and a corresponding side of the semiconductor element;

an underfill agent provided between the semiconductor element and the solder resist, wherein each of the elongated openings comprises:

a first long side facing the semiconductor element;

a second long side facing the corresponding side of the wiring board and being opposite to the first long side;

a first short side; and a second short side opposite to the first short side, wherein the second short side of one of the elongated openings faces the first short side of another one of the elongated openings which is located adjacent to said one of the elongated openings, and wherein an angle formed between the first short side and the first long side is an obtuse angle, and an angle formed between the second short side and the first long side is an obtuse angle.

2. A semiconductor package comprising:

a wiring board comprising a first surface and a second surface opposite to the first surface;

a plurality of pad groups on the first surface of the wiring board, each comprising a plurality of first pads to which an external device is to be electrically connected and which are arranged in a line, wherein each of the pad groups is arranged along a corresponding side of the wiring board;

a solder resist on the first surface of the wiring board comprising a plurality of elongated openings therethrough, wherein each of the pad groups is exposed from a corresponding one of the elongated openings, and wherein each of the openings is arranged along a corresponding side of the wiring board;

a plurality of second pads for flip-chip mounting, which are provided on the first surface of the wiring board to be exposed from the solder resist;

a semiconductor element flip-chip mounted on the first surface of the wiring board to be electrically connected to the plurality of second pads, wherein the semiconductor element is surrounded by the respective elongated openings, and the respective elongated openings are formed between the corresponding side of the wiring board and a corresponding side of the semiconductor element;

an underfill agent provided between the semiconductor element and the solder resist, wherein each of the elongated openings comprises;

a first long side facing the semiconductor element;

a second long side facing the corresponding side of the wiring board and being opposite to the first long side;

a first short side; and a second short side opposite to the first short side, wherein the second short side of one of the elongated openings faces the first short side of another one of the elongated openings which is located adjacent to said one of the elongated openings, and wherein the first and second short sides are formed in a round shape.

3. The semiconductor package of claim 1, wherein the solder resist further comprises a plurality of connection openings each connecting one of the elongated openings and another one of the elongated openings which is located adjacent to said one of the elongated openings, and a width of each of the connection openings is smaller than that of each of the elongated openings.

4. The semiconductor package of claim 2, wherein the solder resist further comprises a plurality of connection openings each connecting one of the elongated openings and another one of the elongated openings which is located adjacent to said one of the elongated openings, and a width of each of the connection openings is smaller than that of each of the elongated openings.

5. The semiconductor package of claim 1, wherein the plurality of first pads are pads for wire bonding.

6. The semiconductor package of claim 2, wherein the plurality of first pads are pads for wire bonding.

7. The semiconductor package of claim 1, wherein the external device is mounted on the wiring board to be electrically connected to the plurality of first pads.

8. The semiconductor package of claim 2, wherein the external device is mounted on the wiring board to be electrically connected to the plurality of first pads.

* * * * *